(12) United States Patent
Luo et al.

(10) Patent No.: US 12,255,432 B2
(45) Date of Patent: Mar. 18, 2025

(54) STABLE UV LASER (71) Applicant: Pavilion Integration Corporation, San Jose, CA (US)

(72) Inventors: Ningyi Luo, San Jose, CA (US); Jihchuang Huang, San Jose, CA (US)

(73) Assignee: Pavilion Integration Corporation, San Jose, CA (US)

( * ) Notice: Subject to any disclaimer, the term of this patent is extended or adjusted under 35 U.S.C. 154(b) by 746 days.

(21) Appl. No.: 17/438,349

(22) PCT Filed: Mar. 11, 2020

(86) PCT No.: PCT/US2020/022160
§ 371 (c)(1),
(2) Date: Sep. 10, 2021

(87) PCT Pub. No.: WO2020/185940
PCT Pub. Date: Sep. 17, 2020

(65) Prior Publication Data
US 2022/0209487 A1 Jun. 30, 2022

Related U.S. Application Data (60) Provisional application No. 62/816,845, filed on Mar. 11, 2019.

(51) Int. Cl.
*H01S 3/30* (2006.01)
*H01S 3/108* (2006.01)
(Continued)

(52) U.S. Cl.
CPC .............. *H01S 3/108* (2013.01); *H01S 3/109* (2013.01); *H01S 5/02476* (2013.01);
(Continued)

(58) Field of Classification Search
CPC ...... H01S 3/108; H01S 3/109; H01S 5/02476; H01S 5/041; H01S 5/14; H01S 5/141;
(Continued)

(56) References Cited

U.S. PATENT DOCUMENTS 6,438,153 B1 8/2002 Caprara et al.
6,693,941 B1 2/2004 Okazaki et al.
(Continued)

FOREIGN PATENT DOCUMENTS

EP 1125349 B1 2/2007

OTHER PUBLICATIONS

International Search Report and Written Opinion of the International Searching Authority. International Application No. PCT/US20/22160 issued by the United States Patent Office, mail date Jun. 3, 2020, 9 pages, Alexandria Virginia.
(Continued)

*Primary Examiner* — Kinam Park
(74) *Attorney, Agent, or Firm* — Peter B Scull (57) ABSTRACT

UV laser devices, systems, and methods are shown and/or described herein. Included are a method, device or system for VECSEL and MECSEL lasers including both barrier-pumped and in-well pumped lasers. Also disclosed is a method of manufacturing gain chips for use in the lasers, arrangements of lasers, and selection of proper non-linear crystal (NLC) for use in the device.

20 Claims, 11 Drawing Sheets

(51) Int. Cl.
- *H01S 3/109* (2006.01)
- *H01S 5/024* (2006.01)
- *H01S 5/04* (2006.01)
- *H01S 5/14* (2006.01)
- *H01S 5/183* (2006.01)
- *H01S 5/34* (2006.01)
- *H01S 5/343* (2006.01)
- *H01S 3/081* (2006.01)
- *H01S 5/02* (2006.01)
- *H01S 5/065* (2006.01)

(52) U.S. Cl.
CPC ............... *H01S 5/041* (2013.01); *H01S 5/14* (2013.01); *H01S 5/141* (2013.01); *H01S 5/183* (2013.01); *H01S 5/3408* (2013.01); *H01S 5/3432* (2013.01); *H01S 3/0815* (2013.01); *H01S 5/0202* (2013.01); *H01S 5/0652* (2013.01); *H01S 5/3407* (2013.01)

(58) Field of Classification Search
CPC ...... H01S 5/183; H01S 5/3408; H01S 5/3432; H01S 3/0815; H01S 5/0202; H01S 5/0652; H01S 5/3407
See application file for complete search history.

(56) References Cited

U.S. PATENT DOCUMENTS

| | | | |
|---|---|---|---|
| 9,112,331 B2* | 8/2015 | Northrup | B82Y 20/00 |
| 9,112,332 B2* | 8/2015 | Wunderer | H01S 5/3222 |
| 9,124,062 B2* | 9/2015 | Wunderer | H01S 5/02461 |
| 2009/0274177 A1* | 11/2009 | Fan | H01S 5/141 372/99 |
| 2013/0250986 A1* | 9/2013 | Wunderer | B82Y 20/00 372/49.01 |
| 2015/0288141 A1* | 10/2015 | Fallahi | H01S 5/423 372/20 |
| 2016/0087407 A1* | 3/2016 | Moloney | H01S 5/34 372/18 |
| 2017/0133825 A1* | 5/2017 | Kilen | H01S 5/18383 |
| 2019/0312408 A1* | 10/2019 | Fallahi | H01S 5/141 |

OTHER PUBLICATIONS

Extended European Search Report including the Supplementary European Search Report for Application No. EP20770343 issued by the European Patent Office, Munich, Germany dated Oct. 25, 2022.
Akovlev, V. et al., Double-diamond high-contrast-gratings vertical external cavity surface emitting laser, Journal of Physics D: Applied Physics, Jan. 10, 2014, pp. 1-8, vol. 47, No. 6, IOP Publishing Ltd., Bristol, England.

* cited by examiner

STABLE UV LASER

BACKGROUND

The present developments relate to an apparatus and method to generate temporally stable ultra violet (UV) light. In many implementations, these may particularly include and/or be directed to methods, systems and/or devices which may use a Semiconductor Thin Disc Laser (STDL) as a Visible Wavelength Laser Light Source (VWLS) and a frequency doubling optics component, such as a Non-Linear Crystal (NLC) or a periodically poled material, to convert the visible light into UV light.

The apparatuses and/or methods that will provide for temporally stable UV light may be used in a variety of applications including but not limited to scanning, spectroscopy/spectrometry, telecommunication applications, and/or medical applications. UV lasers may be well suited for applications on a micro scale that require high quality results. Moreover, UV lasers may be utilized in a variety of commercial and industrial applications, including, but not limited to: machining on a micro-scale, engraving of precision tools for stamping or micro-spark erosion, marking of glass and synthetics whereby the surface is not changed in structure or chemical composition, drilling of small holes in a variety of materials for example diesel injectors, and precision cleaning of surfaces, such as with artwork. These examples and applications of UV lasers are non-limiting examples, as there are myriad applications and uses of UV lasers.

Several possible/optional desiderata for further options of generation of temporally stable high intensity visible light, such as from Vertical External Cavity Surface Emitting Laser(s) (VECSELs) or from Membrane External Cavity Surface Emitting Laser(s) (MECSELs) are described herein. Furthermore, several possible/optional implementations and arrangements related to one or more quantum wells (QWs) or one or more Quantum Dots (QDs), formation and manufacture of QWs, QDs, barrier-pumped lasers, in-well pumped lasers, and cooling of QWs/QDs are also provided. Additionally, several implementations and selections related to the material and length of NLCs are also evident and described.

SUMMARY

UV or frequency up converted laser devices, systems, and/or methods are shown and/or described herein. Included are methods, devices, and/or systems for using a STDL (Semiconductor Thin Disc Laser) as a VWLS (Visible Wavelength Laser Light Source) and a frequency doubling optics component, such as a Non-Linear Crystal (NLC) or a periodically poled material to convert the visible light into UV light. As further described herein, the STDL is electrically or optically pumped to generate the visible laser light. Visible Wavelength Light (VWL) is also referred to herein as visible or VISible light (aka VIS), also an intermediate output that when directed through an NLC can yield a final UV output.

VECSEL based UV lasers are provided and may include a VECSEL quantum well (VECSEL QW or QW) or QD gain chip, a birefringent filter plate (BFP) and/or Etalon, a non-linear crystal (NLC) and one or more mirrors, e.g., cavity mirrors. The VECSEL gain chip when electrically or optically pumped produces a laser photon or output. This laser photon travels on an optical path through a BFP and contacts a first cavity mirror. The first mirror reflects the laser photon or VWL through an NLC crystal of proper length and material to convert the VWL (Visible Wavelength Light, also known as VIS) into stable UV light. The second mirror which is positioned nearly parallel to the first mirror but on the opposite side of the NLC then reflects the stable UV light back toward the first mirror and eventually toward a target outside the cavity.

MECSEL based UV lasers are also provided and include similar structures as the VECSEL described above; however, the MECSEL is able to utilize a third mirror as the MECSEL is centrally located, whereas a VECSEL is terminally or externally located.

Implementations of the VECSEL QW or QD gain chip and the MECSEL QW or QD gain chip are described. The gain chips may be assembled under specific conditions to ensure proper optical bonding is achieved between and among each of the layers of the respective VECSEL QW or QD and MECSEL QW or QD gain chips. The layers and arrangement of heat spreaders are discussed as these provide for proper cooling during high power operation.

In other features, laser systems that employ barrier-pumping and in-well pumping are described. These two techniques and setups may have certain features that may in some instances be employed in some preferred implementations of the developments hereof.

BRIEF DESCRIPTION OF DRAWINGS

For a detailed description of exemplary implementations of the developments, reference will now be made to the accompanying drawings in which.

DETAILED DESCRIPTION

The following discussion is directed to various implementations of the developments hereof. Although one or more of these implementations may be preferred, the implementations disclosed should not be interpreted, or otherwise used, as or for limiting the scope of the disclosure, including the claims. In addition, one skilled in the art will understand that the following description has broad applications, and the discussion of any implementation is meant only to exemplary of that implementation and is not intended to intimate that the scope of the disclosure, including the claims, is limited to that implementation.

Various example implementations are directed to UV lasers, and more particularly to UV lasers that may provide for the efficient and temporally stable generation of UV light from a Visible Wavelength Laser Light Source (VWLS), by using a laser cavity supporting multiple frequencies of VWLS and using length optimized non-linear optics to double the visible frequencies inside the laser cavity into UV light. The specification first turns to a high-level overview of UV lasers in example systems.

As a first note, to achieve visible light to UV conversion there are two elements that may need to be met: (1) temporally stable high intensity of visible light, and (2) a proper non-linear crystal, or periodically poled material to convert the visible light into UV light.

Figure 1A:
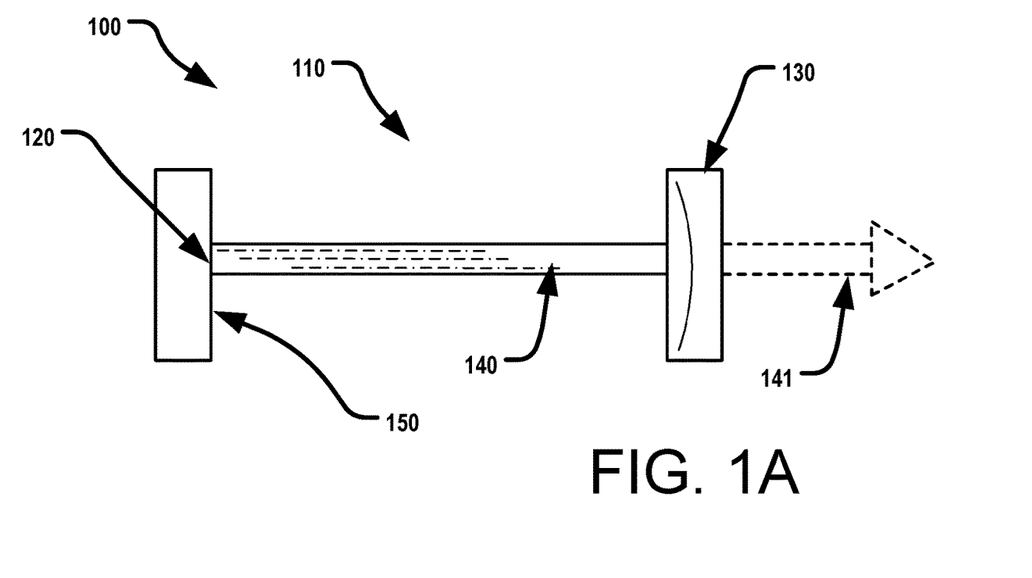
FIG. 1A shows a schematic overview of a VECSEL in accordance with at least some implementations hereof.
Figure 1B:
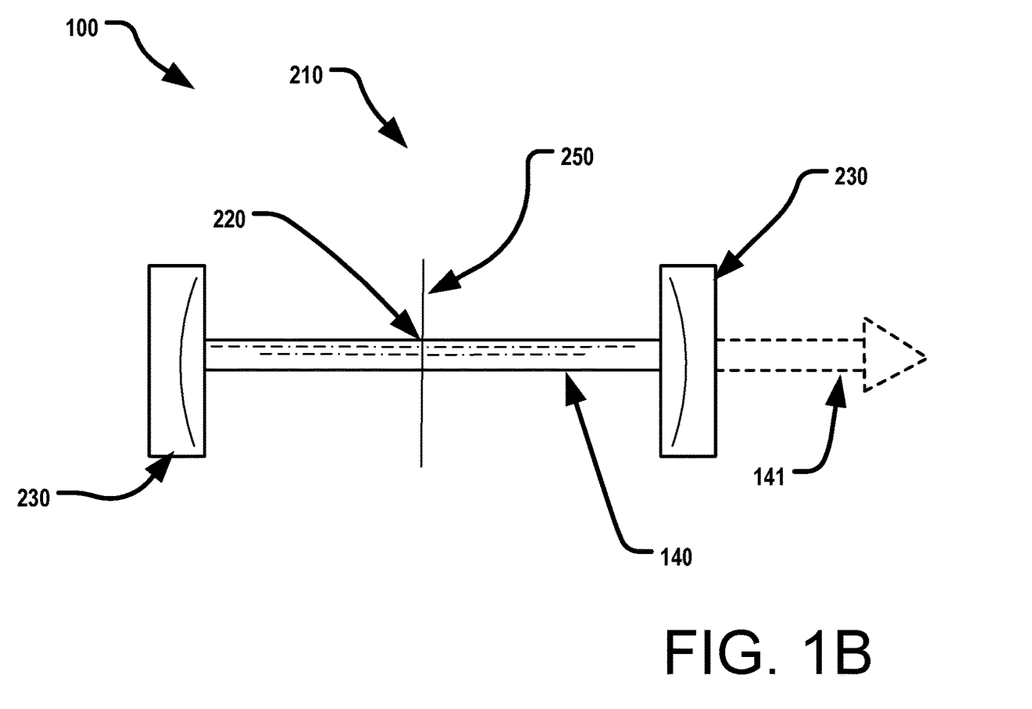
FIG. 1B shows a schematic overview of a MECSEL in accordance with a least some implementations hereof.

FIG. 1A shows a simplified schematic overview of a VIS laser 100 (part of the UV laser), here a VECSEL 110, and FIG. 1B shows a simplified schematic overview of a VIS laser 100 (part of the UV laser), here a MECSEL 210, in accordance with example systems hereof. Myriad other forms of UV or VIS lasers, whether alternative VECSELs or MECSELs, or otherwise, may fit within the scope hereof with no requirement to be limited to the implementations shown, whether in FIGS. 1A or 1B, or otherwise; limited only by the proper scope of the claims appended hereto.

FIG. 1A shows a VECSEL 110 that has a VECSEL gain chip 150 that has one or more quantum wells 120 ("QW" or "VECSEL QW" or a quantum dot, "QD") which may then be the semiconductor gain media for the laser. The gain chip may include one or more laser cavities. The QW 120 may be disposed and/or enclosed inside a corresponding laser cavity, and a few watts of visible light power may, as a result of the enclosing, be extracted from the cavity by using one or more partial or fully reflecting cavity mirrors 130. The cavity mirror 130 can be a dielectric coated mirror or Volume Bragg Grating (VBG) mirror. VBG mirror can also serve as wavelength selecting and limiting device. The VECSEL QW 120 may then generate an output 140. Note, the output or light 140 is the VIS light inside cavity mirrors 130; whereas the further outside output or light 141 is the VIS output outside the cavity mirrors 130. Light intensity inside and outside has a ratio depending on the coating on mirrors 130 and 230. The VECSEL QW 120 may be electrically or optically pumped for the VECSEL QW 120 to produce an output 140. Between the cavity mirrors, the confined visible light 140 power intensity may be at least a factor of 10 or more than its power 141 outside of the cavity mirrors 130. A typical enhancement factor is between 40 and 100 when all cavity mirrors are highly reflective. Thus, a semiconductor thin disc laser cavity, and particularly a VECSEL cavity may provide the necessary visible high intensity light 140 to provide the required temporally stable high intensity visible light 141 requisite for a UV laser.

Alternatively, FIG. 1B shows a UV or VIS laser 100 that may utilize a MECSEL 210 setup. Here, the MECSEL includes a MECSEL gain chip 250 that further comprises MECSEL quantum wells 220 ("QW" or "MECSEL QW") which may then be the semiconductor gain media for the laser. Like the VECSEL setup described above relative to FIG. 1A, the gain chip may include one or more laser cavities. The QW 220 may be disposed and/or enclosed inside a corresponding laser cavity, and a few watts of visible light power may be extracted from the cavity by using one or more partial or fully reflecting cavity mirrors 230. The MECSEL QW 220 may be electrically or optically pumped for the MECSEL QW 220 to produce an output 141. As mentioned above relative to FIG. 1A, the confined visible light 140 power intensity may be at least a factor of 10 or more than its power outside of the cavity mirrors and typically an enhancement factor between 40 and 100 may be achieved when all cavity mirrors are highly reflective. In this way, a MECSEL cavity may provide the necessary visible high intensity light 140 to provide the required temporally stable high intensity visible light required for a UV laser.

The VECSEL QW of FIG. 1A and the MECSEL QW of FIG. 1B may require proper cooling to ensure high power operation. In order to ensure proper cooling of the QWs the gain region of both the VECSEL gain chip and the MECSEL gain chip a layered structure or layered arrangement may be employed. In this technique, heat spreaders and reflectors with desirable characteristics may be layered, or sandwiched, around the QW structure.

Figure 2:
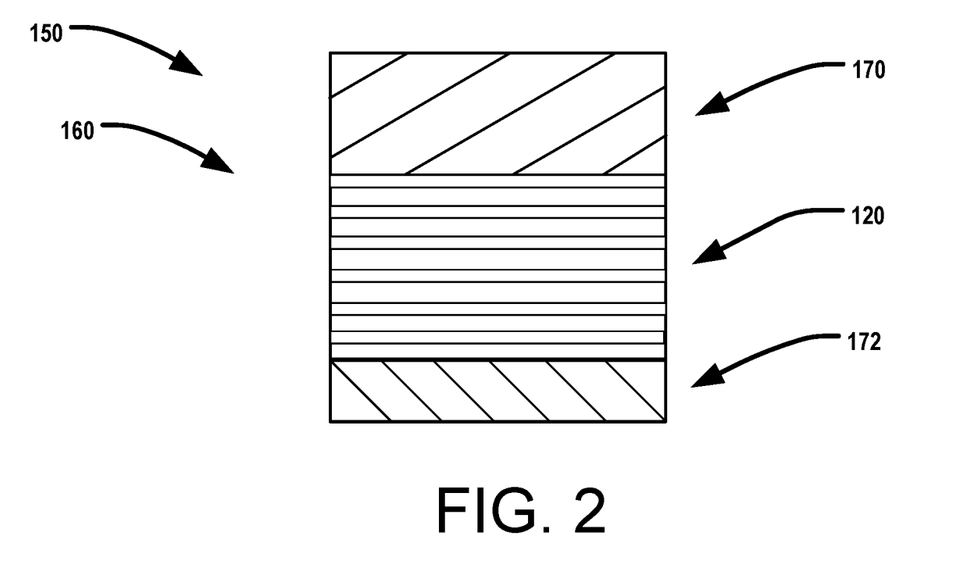
FIG. 2 provides a sectional view of the layers of a quantum well (QW) or QD of a VECSEL gain chip (not to scale), hereof.

Thus, FIG. 2 provides a sectional view of the layers of the gain region 160 for the VECSEL gain chip 150. A heat spreader 170 may be the first layer of a VECSEL structure. The material, or composition, for the heat spreader 170 may be selected from diamond, SiC, or any high-thermal conducting optics can be used as/for a cooling device. In some instances, using SiC instead of diamond as the heat spreader may provide some additional benefit as further discussed below in relation to FIG. 4. In FIG. 2, the second layer is the VECSEL QW 120, and the third layer is a distributed bragg reflector (DBR) 172. One characteristic of the DBR is that the DBR may have high thermal resistance and thus will not help the cooling of the VECSEL as electrical or optical pumping power increases.

Figure 3:
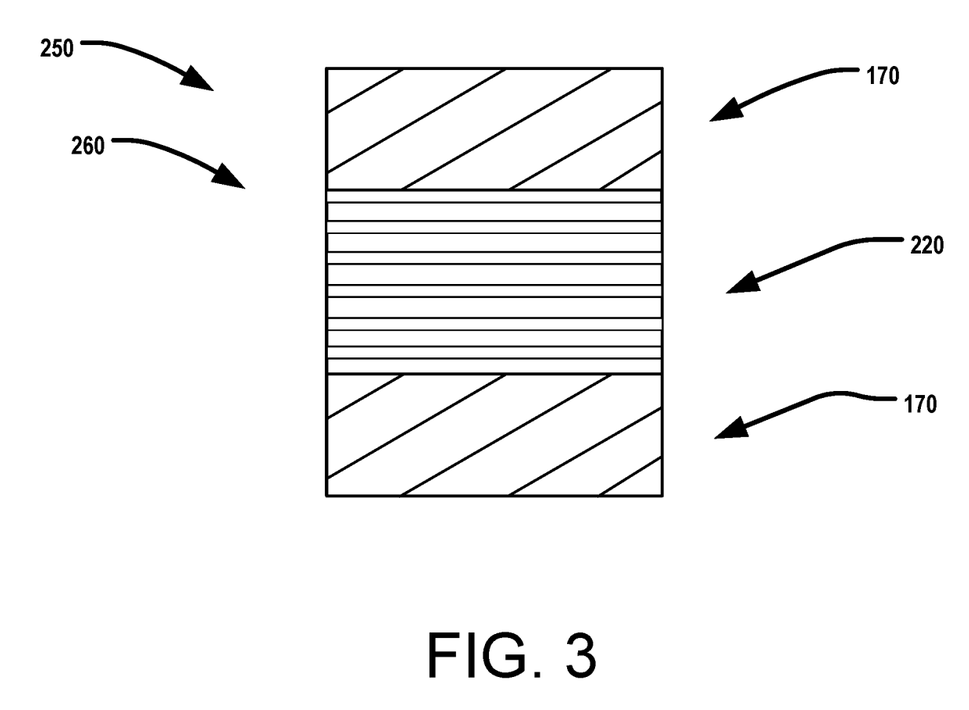
FIG. 3 provides a sectional view of the layers of a gain region of a quantum well (QW) or QD of a MECSEL gain chip (not to scale) hereof.

Further, FIG. 3 shows a sectional view of the layers of the gain region 260 for the MECSEL gain chip 250. A heat spreader 170 may be the first layer of a MECSEL structure. Again, the material, or composition, for the heat spreader 170 may be selected from diamond, SiC, or any high thermal conducting optics. In FIG. 3, the second layer is the MECSEL QW 220, and the third layer is again a heat spreader 170. As shown, the MECSEL's QW layered structure does not have a DBR structure or layer; instead, the additional cooling is achieved by sandwiching the MECSEL QW structure between two cooling devices, or heat spreaders.

Figure 4:
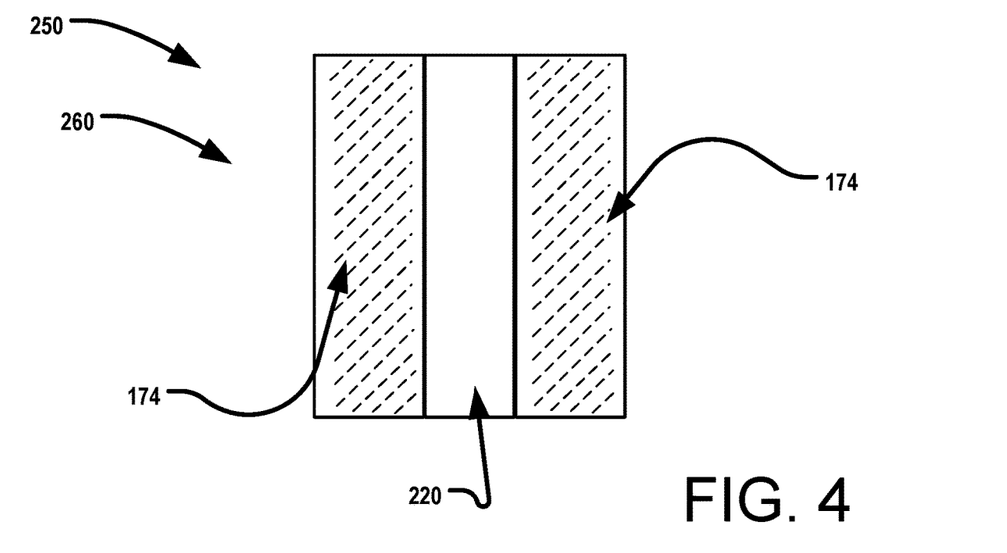
FIG. 4 provides a sectional view of the layers of a gain region of a quantum well (QW) of a MECSEL using SiC as heat spreaders (not to scale) hereof.

As previously mentioned, using SiC as the heat spreader, instead of diamond or other materials, may provide some additional benefit because SiC has a coefficient of thermal expansion (CTE) that that is very similar to that of GaAs and of QW material. VECSELs and MECSELs are often grown on gallium arsenide (GaAs) wafers and thus using SiC as a heat spreader may provide an efficient heat removal material. FIG. 4 provides a sectional view of the gain region 260 for a MECSEL gain chip 250. In this FIG. 4, the MECSEL QW 220 is sandwiched, or layered, between layers of SiC 174. As the pumping power increases, more waste heat must be removed from the QW 220. In this implementation, SiC layers 174 are used as efficient heat removal material. SiC has a CTE of approximately $4\times10^{-6}$ /K which is closer to the QW's CTE (where wafer is made from GaAs and QW is GaInP/AlGaInP/GaAs) which is approximately $5\times10^{-6}$ /K than diamond which has a CTE of approximately $1\times10^{-6}$ /K. At higher power operations, the temperature of the QW may rise as high as 60° C. and a mismatch of CTE, like that of diamond, may cause the device to fracture or overheat and fail. Thus, SiC may avoid this problem as its CTE value is closer to that of GaAs/QW as used in the wafer of the QW.

In one implementation the subject matter hereof may provide for a method of producing a VECSEL gain chip or a MECSEL gain chip, where the QW structure is first grown on the desired substrate, or wafer, such as GaAs. The GaAs substrate typically may have a thickness of 0.2-0.5 mm depending on the wafer diameter. After the QW is grown on the substrate the selected and/or specified heat spreader such as SiC is optically bonded to the QW-GaAs wafer. Optical bonding involves one wafer conforming to the other wafer to maintain good optical and thermal contact. It is noted that, SiC is a hard material which is relatively stiff compared to GaAs which is relatively soft and in some instances brittle. Thus, in order to achieve optical bonding, it may be advantageous to reduce the QW-GaAs wafer thickness from the GaAs side to around 0.1 mm or less. This reduction in thickness makes the QW-GaAs wafer more flexible. The SiC wafer and the thin, or reduced thickness, QW-GaAs wafer are surface activated and pressed together using a bonding process in a standard optical bonding machine such as EVP Group's EVG500 series under high vacuum conditions, such as $10^{-7}$ torr or better. For a VECSEL QW gain chip, only one optical bonding is needed as one side of the VECSEL gain chip is covered by a DBR, as shown in FIG. 2.

For a MECSEL QW gain chip, after SiC-QW-GaAs becomes one single wafer assembly, the assembly is dipped into acid solution such as $H_2SO_4{:}H_2O_2{:}H_2O$, or concentrated sulfuric acid, or $NH_4OH{:}H_2O_2$ to remove the GaAs selectively. Following this acid wash, only the thin QW layer is left on the SiC wafer. A second SiC wafer is then activated and pressed to the SiC-QW, utilizing the bonding process in a standard optical bonding machine under high or ultra high vacuum conditions, described above. The result is the formation of a single SiC-QW-SiC wafer, as shown in FIGS. 3 and 4.

Figures 5A, 5B:
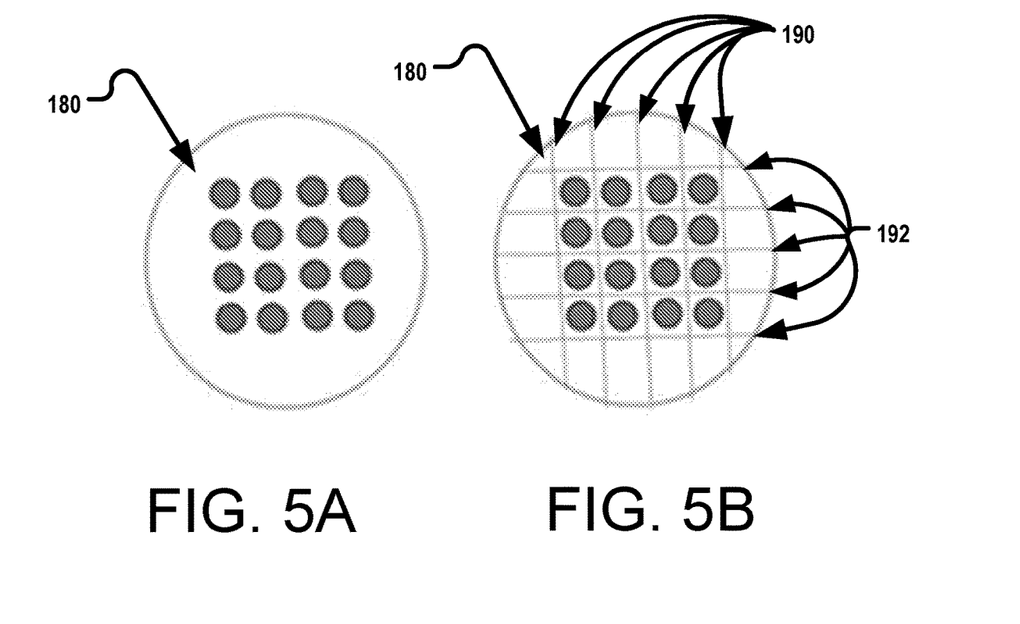
FIG. 5A provides an exemplary pattern related to forming of wafers for VECSELs and/or MECSELs hereof.
FIG. 5B shows an exemplary pattern for laser scribing and breaking to form single gain chips for VECSELs and/or MECSELs hereof.

The SiC-QW-GaAs (VECSEL) wafer and the SiC-QW-SiC (MECSEL) wafer are further processed by applying an anti-reflection (AR) coating and metallization with the pattern 180 as shown in FIG. 5A. The single, or individual, SiC-QW-GaAs (VECSEL) gain chips, and the single, or individual, SiC-QW-SiC (MECSEL) gain chips are then produced by laser scribing and breaking as shown in FIG. 5B. Specifically, the vertical scribe lines 190 and the horizontal scribe lines 192 may form a grid and thus show one exemplary manner for laser scribing and how each individual gain chip might be separated from the larger pattern or array of gain chips 180.

Figure 6:
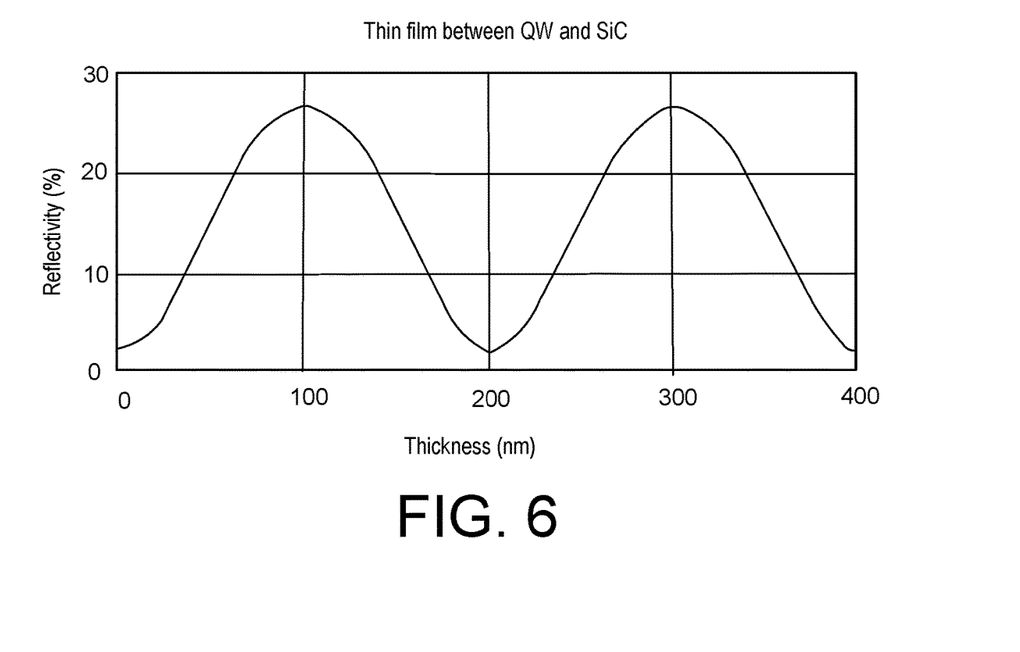
FIG. 6 provides a graph of reflectivity versus the thickness of a thin film that may be placed between a QW and an SiC wafer.

The surfaces of the heat spreader and the QW may have some resistance and/or difficulty in forming a solid and complete optical bond depending on the material compatibility. Adding a thin layer of dielectric material such as CN or SiN to the surfaces of the heat spreader and the QW, may help alleviate the bonding resistance and help the surfaces of the heat spreader and QW bond. The thickness of the film must be chosen properly to minimize optical reflectivity between the heat spreader and the QW. FIG. 6 provides a graph that shows the reflectivity vs. thickness of the film with a refraction index of n=1.7. Accordingly, the best choice for the thickness is 200 nm in this case.

Figures 18A, 18B:
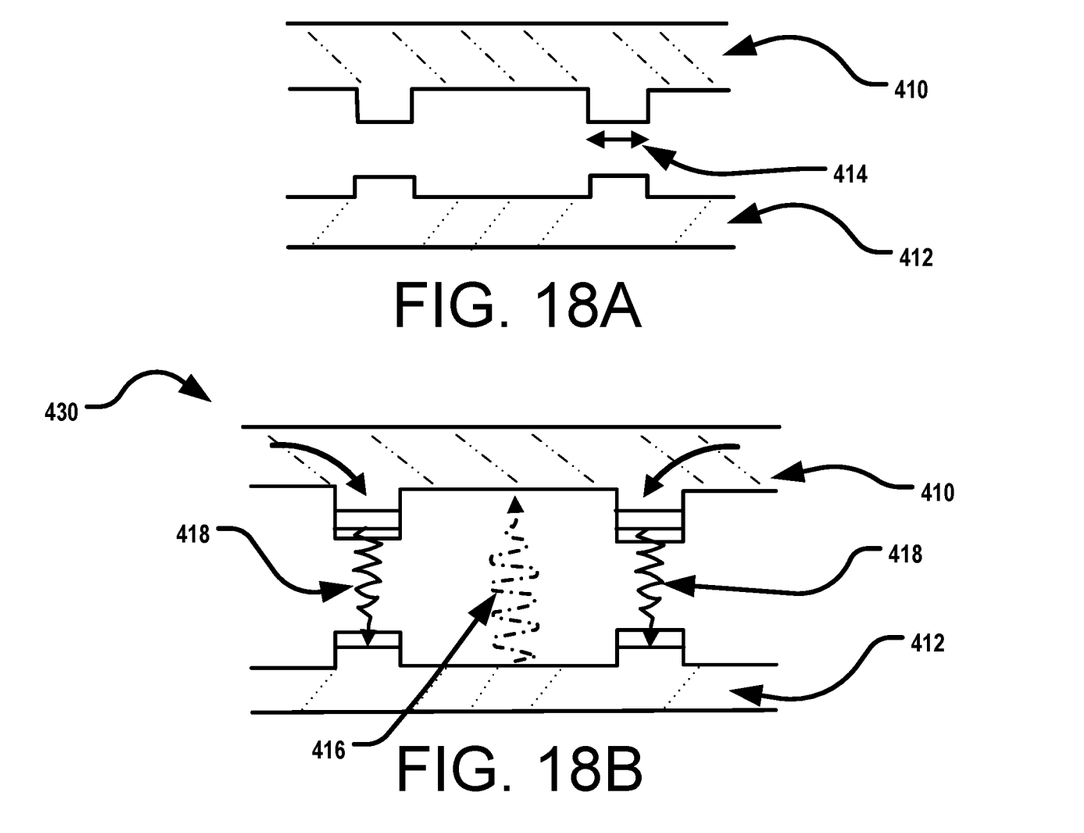
FIG. 18A provides a side view of a valence band and conduction band of the quantum well of an exemplar gain chip hereof.
FIG. 18B provides a side view of a barrier-pumped laser hereof.

FIG. 18A provides a schematic overview of a semiconductor including the conduction band 410 and valence band 412. A quantum well 414 is a depression in the semiconductor's valence and conduction bands. One implementation hereof may include increasing the quantum efficiency of a barrier pumped laser 430. In a barrier-pumped laser 430, such as the schematic overview provided in FIG. 18B, pump photons 418 boost an electron 416 from the valence band 412 of the bulk into the conduction band 410. In order to maximize the quantum efficiency in a barrier pumped laser, a QW hereof, is designed to absorb pump light as close as 6% difference in the photon energy between the pumping wavelength and the lasing wavelength. For example, in the developments hereof, one implementation uses 640 nm as pumping light to produce 680 nm light. The difference between 640 nm and 680 nm is approximately 6%, which by comparison is significantly less than other laser designs which may use 532 nm pumping wavelength to produce 680 nm lasing wavelength, which is approximately a 28% difference between the photon energy between the pumping wavelength and the lasing wavelength.

Figure 18C:
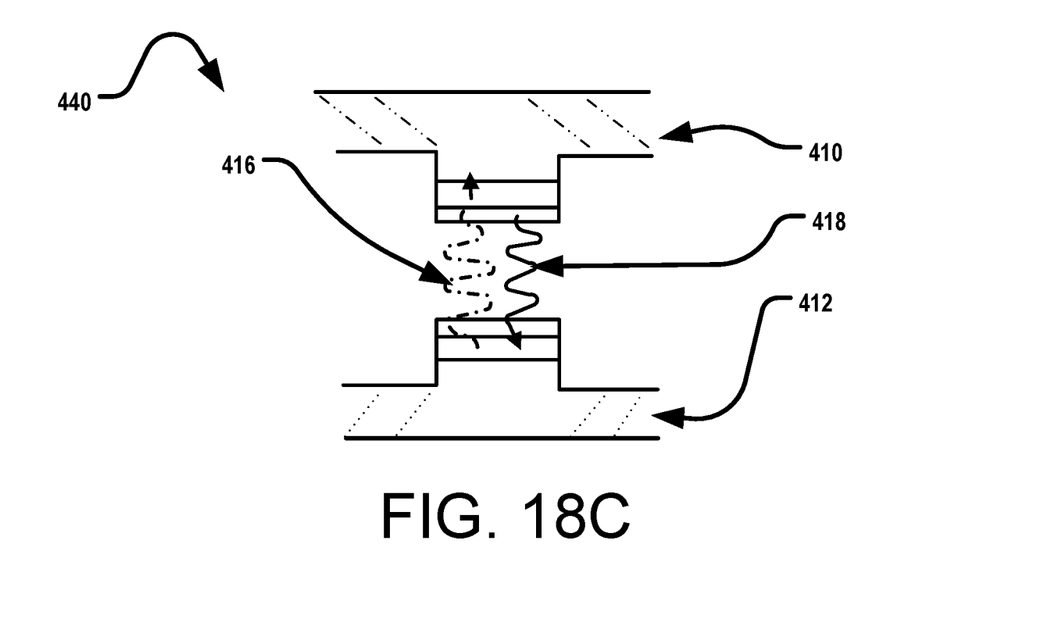
FIG. 18C provides a side view of an in-well pumped laser hereof.

In yet another implementation of the present developments hereof, the quantum efficiency may be further increased for in-well pumped lasers. In-well pumped lasers refers to the structure and methods utilized in lasers, in which the pump light is absorbed solely in the quantum wells. FIG. 18C provides an in-well-pumped laser 440, where the pump photon 418 lifts an electron 416 from a level in the quantum well's valance band 412 to the conduction band 410. In one implementation of the developments hereof, the QW is designed to absorb light as close as approximately 3% difference in the photon energy between the pumping wavelength and the lasing wavelength. In one implementation, for in-well pumped laser hereof, the pumping wavelength is 660 nm and the lasing wavelength is 680 nm. Furthermore, combining SiC contact cooling and in-well pumping together may maximize the generated visible light power. The in-well pumping structures, methods, and techniques may be known to those skilled in the art, and are also disclosed in, several publications for example, "Direct Pumping of Quantum Wells Improves Performance of Semiconductor Thin-Disk Lasers" Photonics Spectra (June 2005) and "Enhanced Efficiency of AlGaInP Disk Laser by In-well Pumping" Optics Express, p. 2472 (2015).

Figure 7:
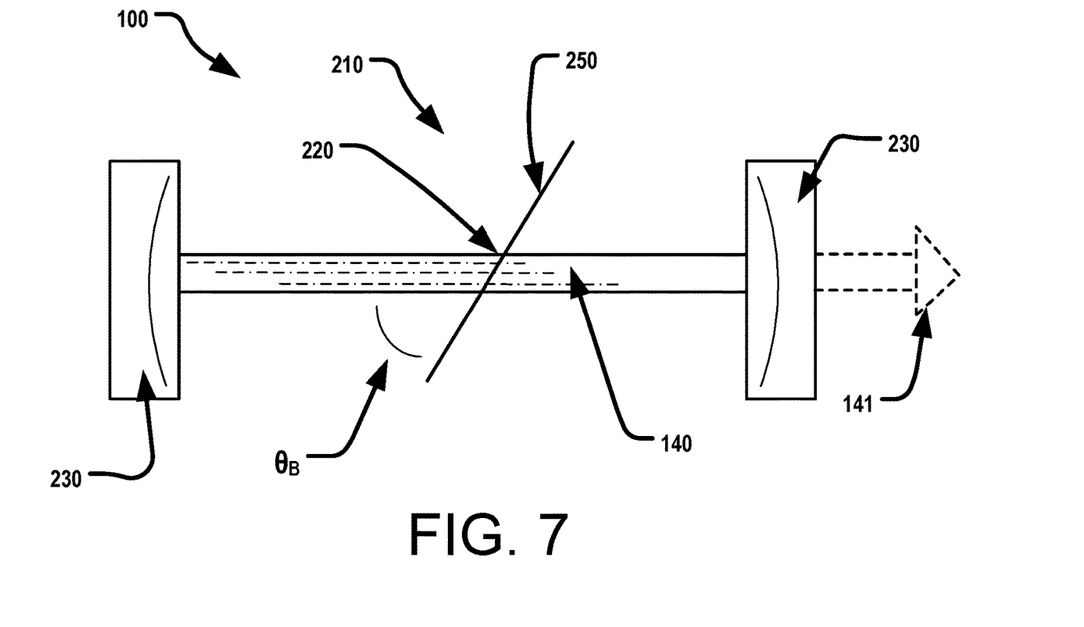
FIG. 7 shows a schematic overview of a MECSEL where a gain chip is placed at the Brewster's angle relative to the optical path.

FIG. 7 shows a schematic overview of an alternative implementation and arrangement of a MECSEL. In particular, FIG. 7 shows UV or VIS laser 100, here a MECSEL 210 includes a MECSEL gain chip 250 that further has one or more MECSEL quantum wells 220 ("QW" or "MECSEL QW") which may provide the semiconductor gain media for the laser. Like the MECSEL described in FIG. 1A above, by enclosing the QW 220 inside a laser cavity, a few watts of visible light power can be extracted from the cavity by using one (or more) partial reflecting cavity mirror(s) 230. When electrically or optically pumped, the MECSEL QW 220 produces an output or VIS 140. Note that in this alternative implementation, that to eliminate that AR coating on the MECSEL's gain chip for VWL the MECSEL gain chip 250 is placed at the Brewster angle $\theta_B$ (or a polarization angle) relative to the optical path. The Brewster angle may help avoid some amount of optical loss due to imperfect coating on the gain chip.

In one implementation of the current developments utilizing a highly multimode operation may be included which may eliminate a feedback loop related to power stability. The STDL has a bandwidth larger than several nm which contains multiple frequencies. The STDL may provide the stable VWLS at ~1 nm of bandwidth. The bandwidth can be further controlled by adding a wavelength limiting optic such as a birefringent filter plate (BFP) depending on the bandwidth requirement. Using the above described highly multimode operation, this alternative implementation may be able to provide temporally stable high intensity VWLS. This alternative feature may allow the developments hereof to avoid the mode beating problem while also avoiding single mode operation which may result in power instability due to the cavity length change with temperature. Moreover, by using a highly multimode operation, the implementations hereof may also be able to avoid a complicated feedback system to maintain the power stability, which may be a desirable characteristic for a UV laser.

The selection of the proper NLC to be used in a UV laser device hereof may need to have specific properties and characteristics to produce the desired UV light. These properties and characteristics, may include, but are not limited to: (1) transparent in the corresponding VWL and UV wavelengths; (2) a high non-linear coefficient; (3) a large band width to support multiple frequencies simultaneously; and (4) a minimum walk-off angle. Exemplar NLCs that provide the desired characteristics may include: (a) periodically poled crystal such as Lithium Tantalate (PPLT or PPSLT); and/or, (b) periodically poled LaBGeO$_5$ (PPLBGO). For both PPLT and PPLBGO, either first, second, or higher order can be used.

Figure 8:
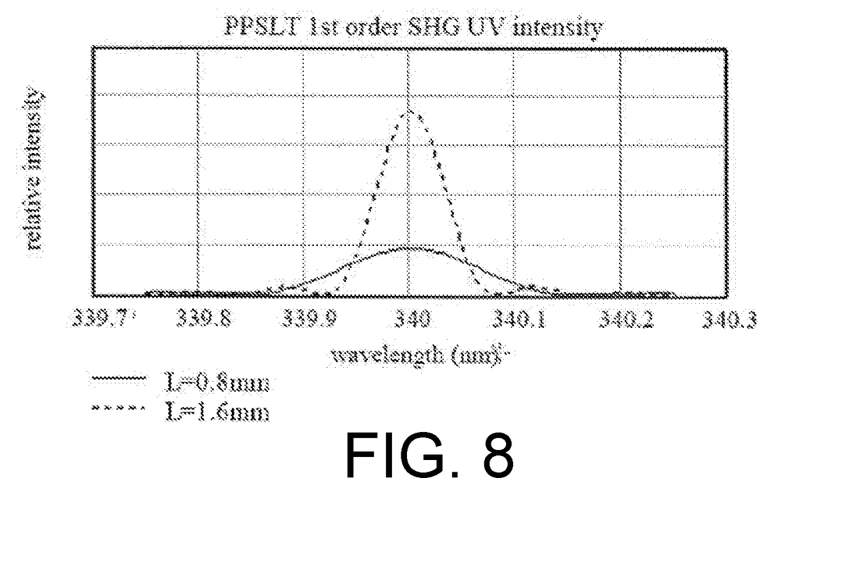
FIG. 8 provides a graph that demonstrates the relative intensity versus the wavelength (bandwidth and UV conversion efficiency) for two Non-Linear Crystals (NLCs) lengths under similar Visible Wavelength Laser Light Source (VWLS) conditions.
Figure 9:
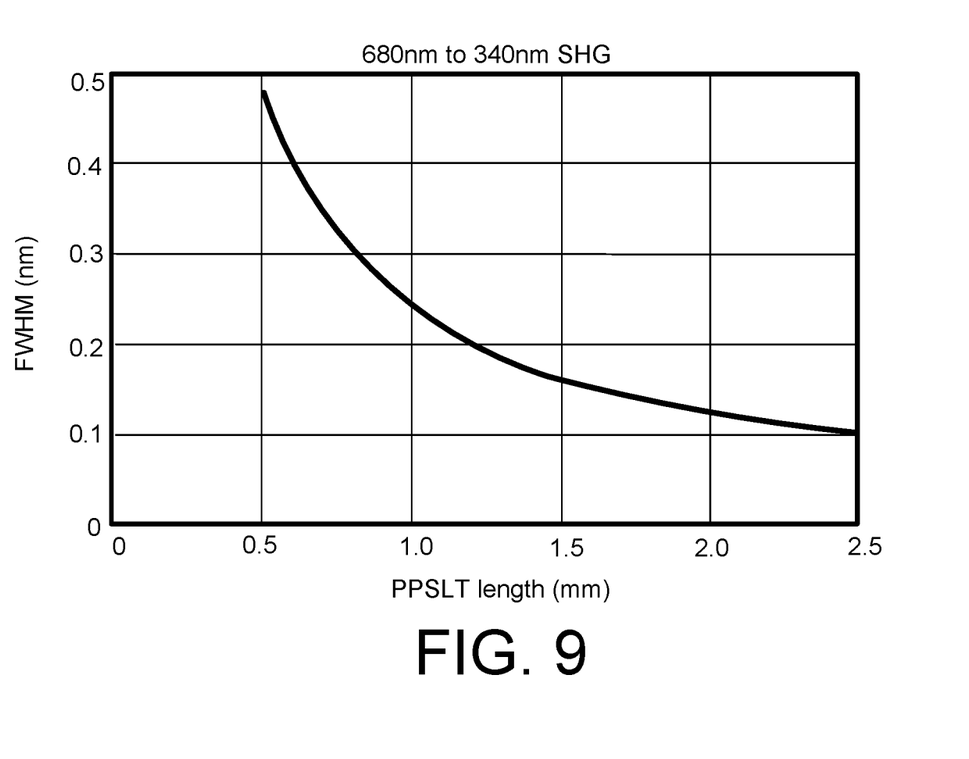
FIG. 9 provides a graph of Full Width at Half Maxima (FWHM) plotted versus Periodically Poled Stoichiometric Lithium Tantalate (PPSLT) length.

FIG. 8 provides a graph that demonstrates the relative intensity versus the wavelength (bandwidth and UV conversion efficiency) for two Non-Linear Crystals (NLCs) lengths under similar Visible Wavelength Laser Light Source (VWLS) conditions. FIG. 8 further demonstrates that that the NLC length must be chosen properly, and that the length of the NLC plays an important role in the preferred function of the UV laser. Longer crystals may provide higher conversion efficiency but limits the band width. Therefore, the bandwidth requirement places a limit on the maximum length of the NLC. A cavity length of 60 mm has mode spacing of 2.5 GHz (~0.004 nm at 680 nm). A 1.6 mm long PPSLT has 0.1 nm band width of full width at half maxima (FWHM) which allows ~25 frequencies to oscillate inside such a cavity. Thus, FIG. 8 demonstrates the bandwidth and UV conversion efficiency at two NLC lengths under similar VWLS power density. Further, FIG. 9 provides a graph that demonstrates that the NLC length is governed by the bandwidth requirement of the FWHM as shown.

Figure 10:
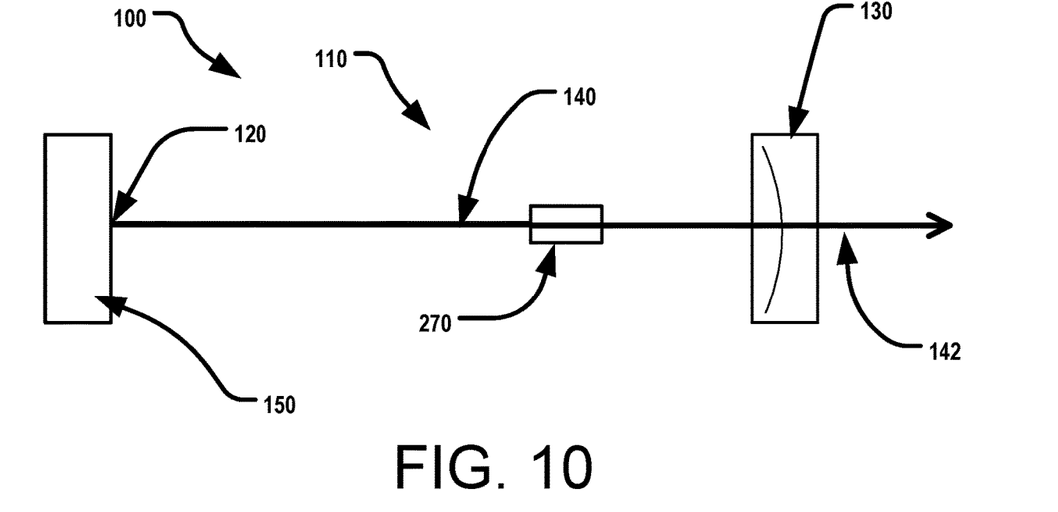
FIG. 10 provides a schematic overview of a basic UV laser using VECSEL in accordance with at least some implementations hereof.

FIG. 10 provides a schematic overview of an exemplary UV laser 101, here a VECSEL 110. The VECSEL 110 includes a VECSEL gain chip 150 that has one or more quantum wells 120 ("QW" or "VECSEL QW") that may be the semiconductor gain media for the laser. In this example, the electrically or optically pumped semiconductor thin disk gain media, or gain chip, 150, also serves as a first cavity mirror. In FIG. 10, an NLC 270 is placed between 120, 130 in the output or optical path 140, where the NLC serves to produce UV light as the output or VIS 140 passes through the NLC. The UV light then travels and passes through the partial reflecting or specially coated UV transmitting cavity mirror 130. The gain chip 150 contains an intra-cavity SiC heat spreader with a thin layer of CN or SiN coating between the heat spreader and the GaAs wafer as described inter alia.

Figure 11:
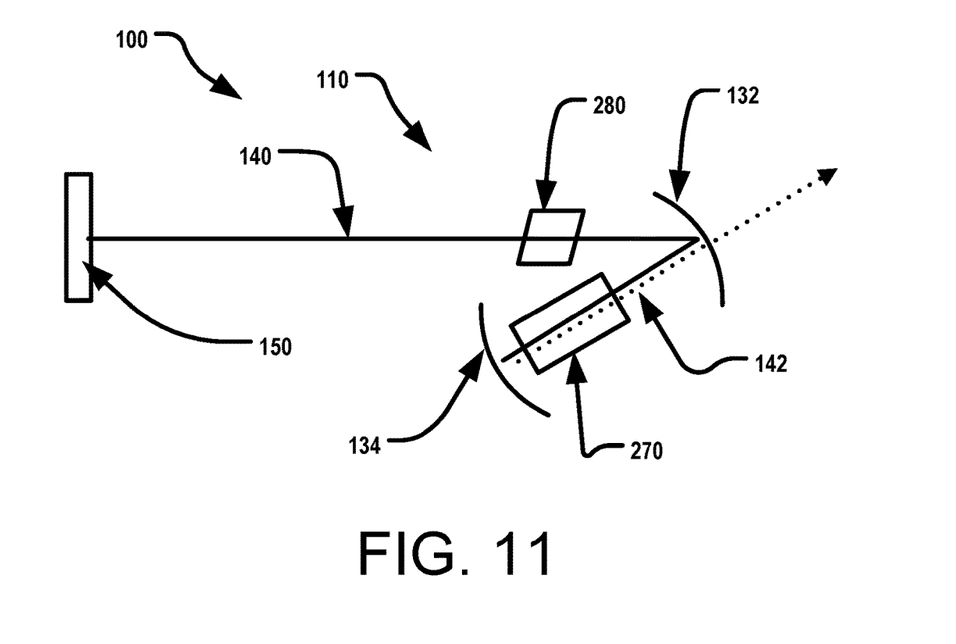
FIG. 11 provides a schematic overview of a UV laser using VECSEL in accordance with at least some implementations hereof.

FIG. 11 provides yet another schematic overview of an alternative implementation of a UV laser 101, here a VECSEL 110. In this configuration, the NLC 270 is placed inside the cavity that contains a VECSEL gain chip 150 that has one or more quantum wells 120. In this implementation, a BFP 280 is placed in the output or optical path 140. In this implementation a first specialized mirror 132 is placed after the BFP in line with the optical path. The first specialized mirror 132 is unique in that it has an inner surface coated to reflect on VWL and high transmission of UV to extract UV light. The first specialized mirror 132 is angled to reflect or direct the output or VIS 140 through an NLC 270 and toward a second specialized mirror 134. The second specialized mirror 134 has an inner surface coated to reflect both VWL and UV wavelengths. The second specialized mirror 134 reflects the UV laser output or beam 142 through the NLC 270 and back through the first specialized mirror 132. Thus, the UV light generated in both directions, the left bound one is reflected by the second cavity mirror 134 back to merge with the right bound one as a single UV output 142. In this way, a stable VECSEL based UV laser output 142 is achieved.

Figure 12:
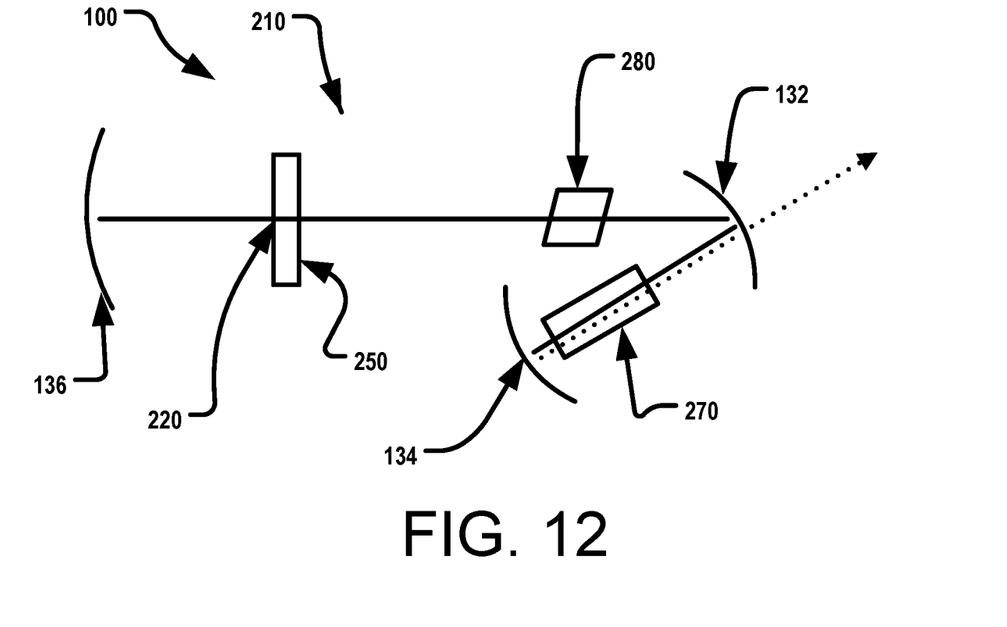
FIG. 12 provides a schematic overview of a UV laser using MECSEL in accordance with at least some implementations hereof.

FIG. 12 provides yet another schematic overview of an alternative implementation of a UV laser 101 that utilizes a MECSEL 210. In this implementation, the NLC 270 is placed inside the cavity that contains a MECSEL gain chip 250 that has one or more quantum wells 220. In this implementation, a BFP 280 is placed in the output 140 or optical path 140. A first mirror 132 is placed after the BFP but in line with the optical path. The first specialized mirror 132 is unique in that it has an inner surface coated to reflect on VWL and transmission of UV to extract UV light. The first specialized mirror 132 is angled to reflect or direct the output or VIS 140 through an NLC 270 and toward a second specialized mirror 134. The second specialized mirror 134 has an inner surface coated to reflect both VWL and UV wavelengths. The second specialized mirror 134 reflects the UV laser output through the NLC 270 and back through the first specialized mirror 132. Thus, the UV light generated in both directions, the left bound one is reflected by the second cavity mirror 134 back to merge with the right bound one as a single UV output 142. A third mirror 136 is placed behind the MECSEL's gain chip 250 to reflect back the VWL. By using mirrors 136, 132, and 134 together, a stable VIS cavity is achieved. In this way, a stable MECSEL based UV laser is achieved.

Figure 13:
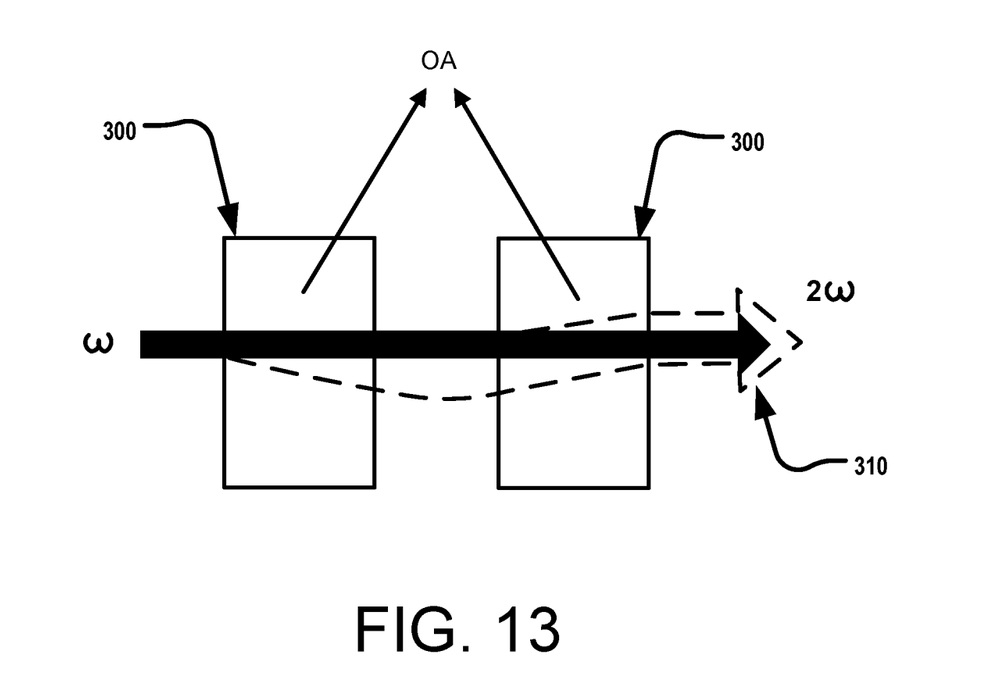
FIG. 13 provides a schematic overview of a walk-off compensated NLC in accordance with at least some implementations hereof.

FIG. 13 provides a schematic overview of a walk-off compensated NLC in accordance with at least some implementations of developments hereof. A walk-off compensated NLC available from the crystal supplier may be used to satisfy a minimum walk-off requirement. For example, FIG. 13 provides a pair of beta-Barium Boron Oxide (BBO) optics 300 with the same phase matching angle are arranged in the opposite direction to bring the deviated beam (2ω) 310 back to center again. The spacing between these two BBOs 300 can be reduced to zero or in optical contact.

Figure 14:
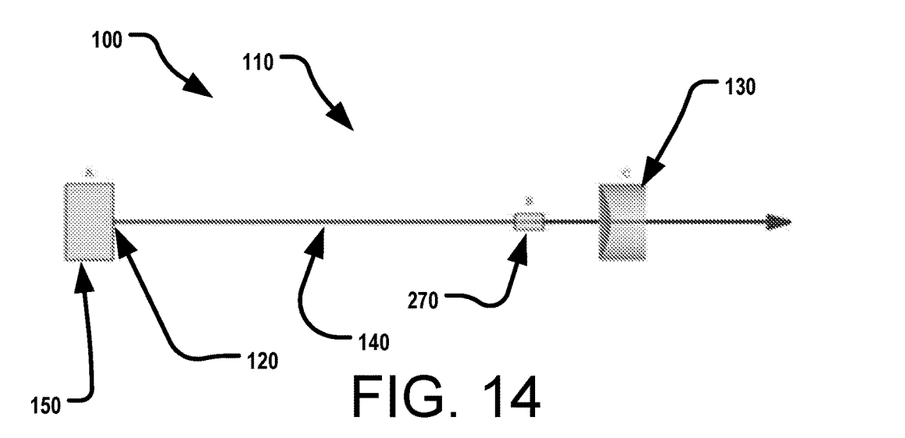
FIG. 14 provides a schematic overview of an electrically or optically pumped VECSEL hereof.

FIG. 14 provides a UV laser 101, here a VECSEL 110. The VECSEL 110 includes a VECSEL gain chip 150 that has one or more quantum wells 120 ("QW" or "VECSEL QW") which may provide the semiconductor gain media for the laser. In this example, the electrically or optically pumped semiconductor thin disk gain media, or gain chip, 150, also serves as a first cavity mirror. In FIG. 14, an NLC 270 is placed in the output or optical path 140, where the NLC serves to produce UV light as the output or VIS passes through the NLC. The UV light then travels and passes through the partial reflecting or specially coated (highly reflective VIS and highly transmissive UV) cavity mirror 130. The gain chip 150 contains an intra-cavity SiC heat spreader with/without a thin layer of CN or SiN coating between the heat spreader and the GaAs wafer as described inter alia.

Figure 15:
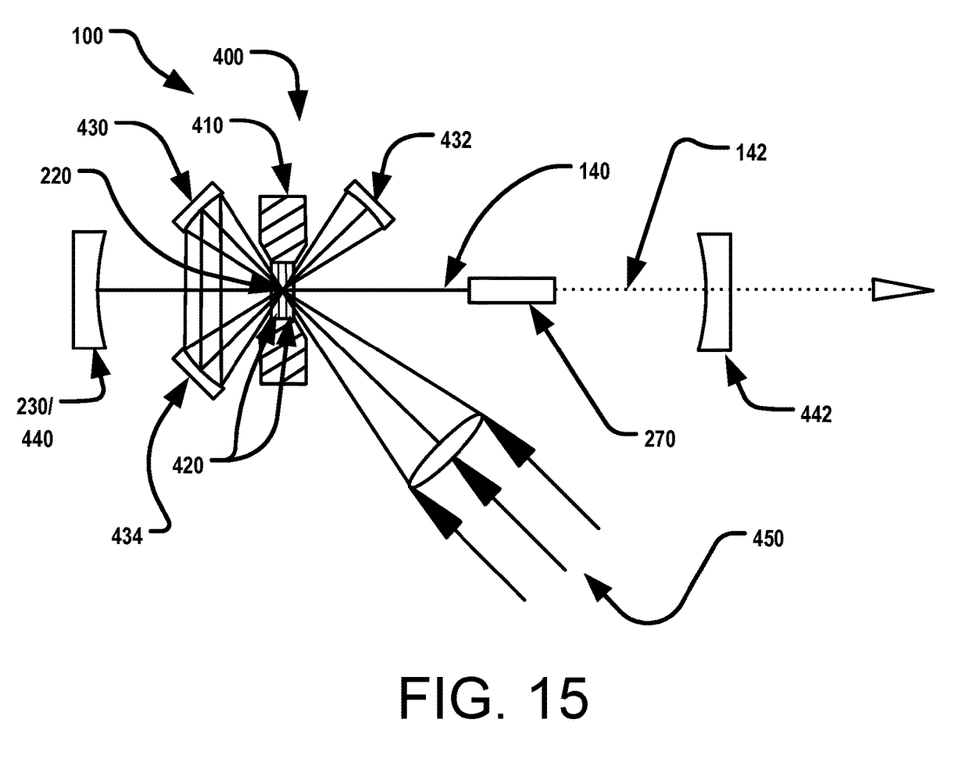
FIG. 15 shows a schematic overview of an in-well pumped MECSEL in a straight cavity hereof.

FIG. 15 provides a UV laser 101, here an in-well pumped MECSEL 400. The MECSEL assembly 410 includes SiC heat spreaders 420 that may or may not have CN or SiN film layers as described elsewhere in this disclosure. Pumping light optics 430, 432, 434 are positioned at select locations around the MECSEL to recycle the unabsorbed pump light back to MECSEL for multiple passes in the in-well pumping. By enclosing the in-well pumped MECSEL 400 inside a laser cavity, a few watts of visible light power can be extracted from the cavity by using one (or more) cavity mirror(s) 230/440. An NLC 270 is positioned in the output 140, or optical path 140, to convert VWL to stable UV light 142. A second cavity mirror is located at the opposite end of the cavity, as the first cavity mirror 442. Thus, FIG. 15 provides an in-well pumped MECSEL 400 where the MECSEL QW 220 is sandwiched between CTE compatible heat spreaders 420 to support multi-frequency of high intensity VWL output 140. In this implementation, red light pumping 450 is used to pump the MECSEL QW 220. In FIG. 15, an NLC 270 such as PPLT/PPLST or PP-LBGO of appropriate length may be utilized to convert the multi-frequency output 140, into stable UV light 142. Other variations and implementations, of such a configuration may be employed to create a stable UV light 142 as further disclosed and described inter alia.

Figure 16:
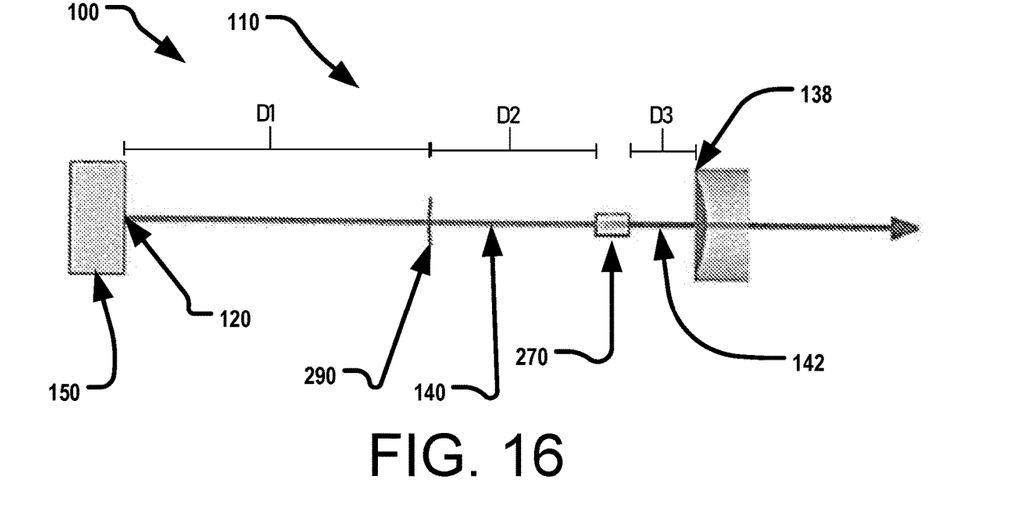
FIG. 16 provides a schematic overview of some alternative additional optics and distances of an exemplary VECSEL, in accordance with at least some implementations hereof.

FIG. 16 provides schematic overview of an arrangement of a VECSEL that may provide and enable a wide range of UV power output through the use of additional optics. FIG. 16 provides a UV laser 101, here a VECSEL 110. The VECSEL 110 includes a VECSEL gain chip 150 that has one or more quantum wells 120 ("QW" or "VECSEL QW") which may be or provide the semiconductor gain media for the laser. In this example, the electrically or optically pumped semiconductor thin disk gain media, or gain chip, 150, also serves as a first cavity mirror. In FIG. 16, an NLC 270 is placed in the output or optical path 140, where the NLC 270 serves to produce UV light 142 as the output VIS passes through the NLC 270. The UV light 142 then travels and passes through the partial reflecting or special coated (highly reflective VIS and highly transmissive UV) cavity mirror, or end mirror 138. The gain chip 150 contains an intra-cavity SiC heat spreader with/without a thin layer of CN or SiN coating between the heat spreader and the GaAs wafer as described inter alia. FIG. 16 also provides or includes a focusing lens 290.

In FIG. 16, additional optics, such as a focusing lens 290 may be utilized to increase the power output of the UV laser. The focusing lens 290 may have a focal length of F1. The end mirror 138 may have a radius of curvature of R2. Also provided in FIG. 16 are distances: D1, D2, and D3; where, D1 represents the distance between the surface of the VECSEL gain chip 150 and the focusing lens 290; D2 represents the distance between the focusing lens 290 and the NLC 270; and D3 represents the distance between the NLC 270 and the end mirror 138. In one aspect, the UV power output may be adjusted by setting the F1/R2 to be equal to approximately 1 and the value of D1/(D2+D3) to be equal to approximately 2. In this manner, the laser may be operated at a wide range of power levels.

Figure 17:
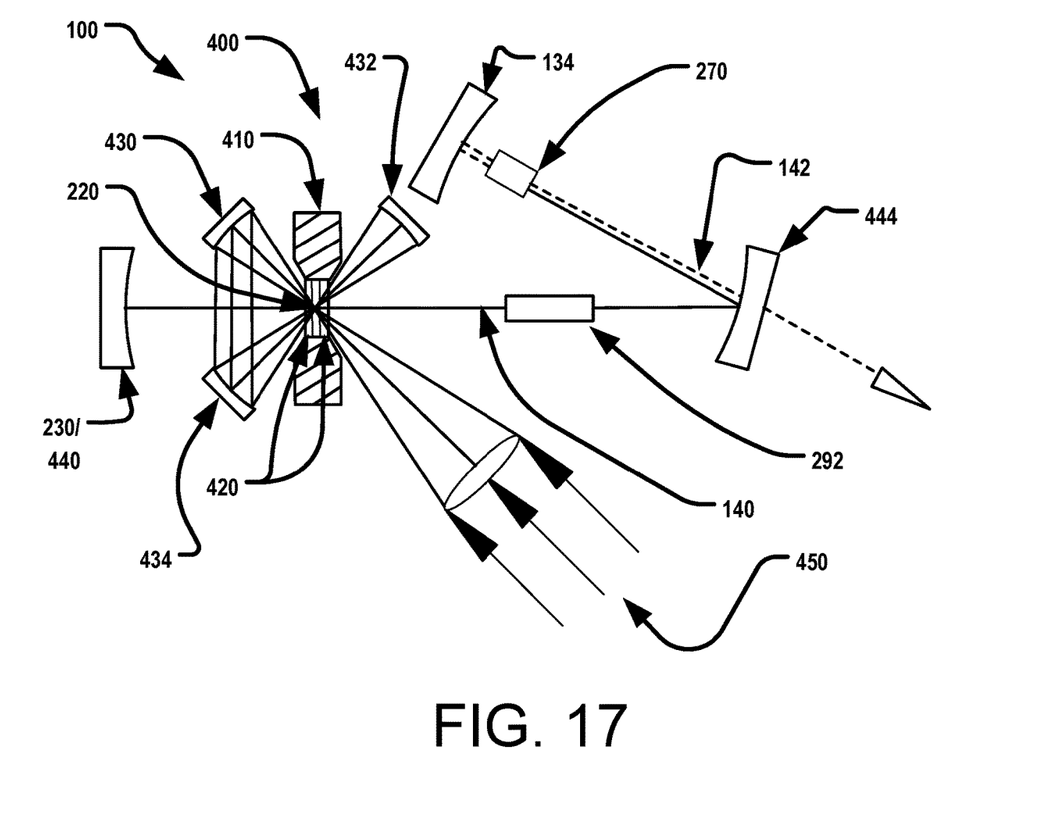
FIG. 17 provides a schematic overview of a MECSEL in a V-shaped cavity with an in-well pumping layout.

FIG. 17 provides yet another schematic overview of a UV laser 101, here an in-well pumped MECSEL 400. The MECSEL assembly 410 includes SiC heat spreaders 420 that may or may not have CN or SiN film layers as described elsewhere in this disclosure. Pumping light optics 430, 432, 434 are positioned at select locations around the MECSEL to recycle unabsorbed pump light for multiple passes. By enclosing the in-well pumped MECSEL 400 inside a laser cavity, a few watts of visible light power can be extracted from the cavity by using one (or more) cavity mirror(s) 230/440. In this example, a wavelength selecting and limiting optics 292 is positioned in the output or VIS 140, or optical path, to select and limit the VWF output 140. A second cavity mirror 444 is located at the opposite end of the cavity, as the first cavity mirror 440. The VWF output 140 is reflected by the second cavity mirror through an NLC 270 to convert the multi-frequency output or VWF to UV light 142. The UV light is generated in both directions and the left bound one is reflected by a third cavity mirror 134 back to merge with the right bound one as a single UV output 142. Thus, FIG. 17 provides an in-well pumped MECSEL 400 where the MECSEL QW 220 is sandwiched between CTE compatible heat spreaders 420 to support multi-frequency of high intensity VWL output 140. In this implementation, red light pumping 450 is used to pump the MECSEL QW 220. In FIG. 17, an NLC 270 such as PPLT/PPLST or PP-LBGO of appropriate length may be utilized to convert the multi-frequency output VIS 140, to stable UV light 142. Other variations and implementations, of such a configuration may be employed to create a stable UV light 142 as further disclosed and described inter alia.

Figure 19A:
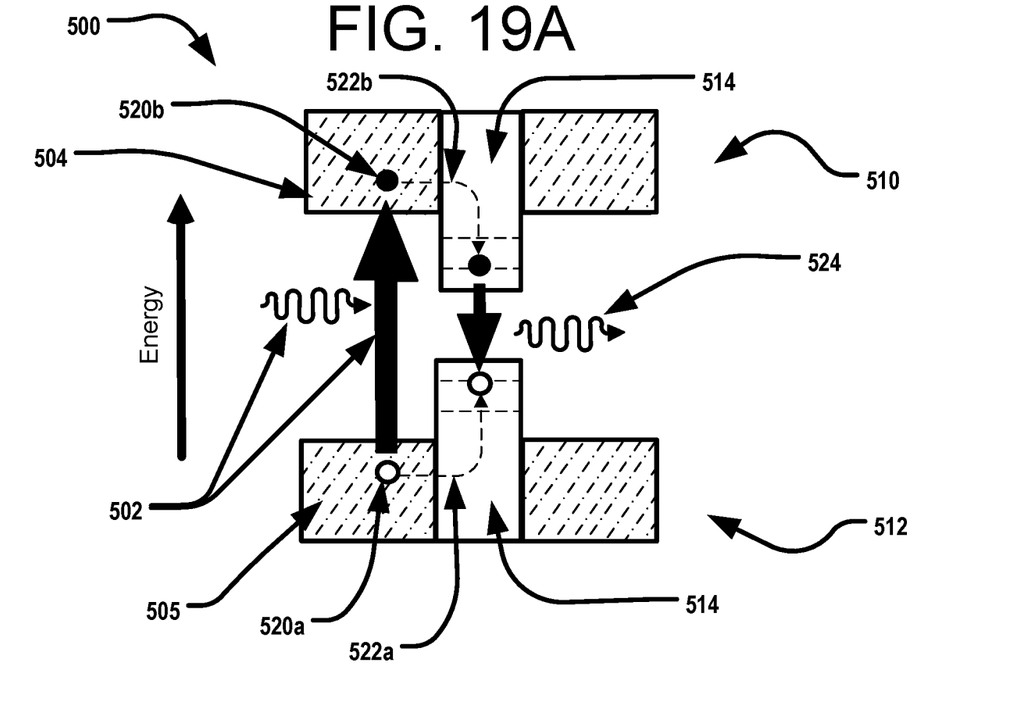
FIG. 19A provides a side view schematic diagram of an alternative barrier-pumped laser hereof.

FIG. 19A shows an example of a barrier-pumped laser 500. In FIG. 19A, a pump photon 502 is pumped into the barrier 504a of the conduction band 510. The pumping of the pump photon 502 into the barrier 504 creates an electron hole pair 520a, 520b in the barrier 505. The electron hole pair 520a, 520b migrates (as indicated by dashed lines 522a, 522b) to one of the quantum wells 514 where it recombines to create a laser photon 524.

Figure 19B:
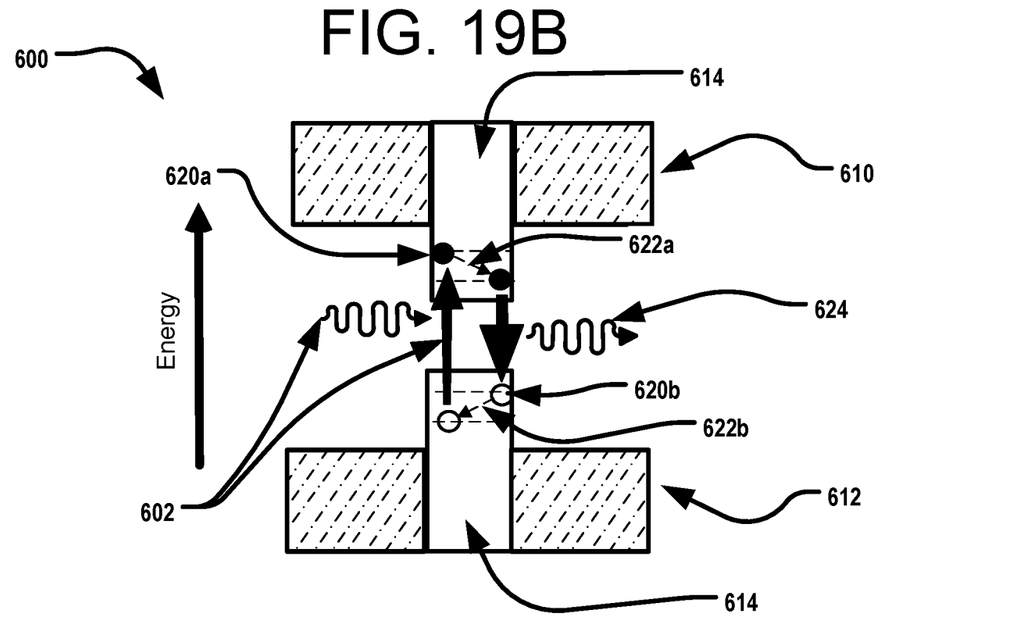
FIG. 19B provides a side view schematic diagram of an alternative in-well pumped laser hereof.

FIG. 19B shows an example of an in-well pumped laser 600. In FIG. 19B, a pump photon 602 is pumped into a well 614 of the conduction band 610. The pump photon 602 is absorbed in the quantum well 614, which creates an electron-hole pair 620a, 620b in the quantum well 614. After relaxation (as indicated by dashed lines 622a, 622b) to the ground state, it recombines into a laser photon 624. The difference in energy between pump and laser photon, referred to as the quantum defect, is deposited as heat in the heat spreaders, as described in FIGS. 1A, 1B, and 2, inter alia.

The above discussion is meant to be illustrative of the principles and various implementations of the present developments. Numerous variations, ramifications, and modifications of the basic concept which have not been described may become apparent to those skilled in the art once the above disclosure is fully appreciated. It is intended that all such ramifications and variations be included within the scope of the appended claims and their legal equivalents, and the scope of the invention not be limited by the examples given, or the claims hereof.

What is claimed is:

1. A UV laser comprising:
  a gain chip having one or more quantum wells or one or more quantum dots and as a semiconductor gain media for the laser, wherein:
    the gain chip has one or more semiconductor thin disc laser cavities, the semiconductor thin disc laser cavity being a MECSEL cavity,
    the one or more quantum wells or one or more quantum dots are enclosed inside the one or more thin disc laser cavities,
    the gain chip comprises an optically bonded heat spreader as a first layer thereof, the heat spreader being a cooling material or composition selected from SiC, GaAs or a high-thermal conducting optic material having a coefficient of thermal expansion similar to that of the semiconductor gain media;
  at least two mirrors, wherein at least one of the at least two mirrors is highly reflective and at least one of the at least two mirrors is partially reflective, and wherein the at least two mirrors are disposed to extract UV light from the one or more thin disc laser cavities;
  a Visible Wavelength Laser Light Source, VWLS, wherein the one or more thin disc laser cavities support multiple frequencies of VWLS; and
  length optimized non-linear optics to double the visible frequencies inside the one or more thin disc laser cavities into UV light,
  wherein the UV laser is a MECSEL with a MECSEL setup with the at least two mirrors being operatively disposed disparately relative to the gain chip.

2. A UV laser according to claim 1; the one or more quantum wells being one or more of:
  electrically pumped or
  optically pumped,
  including fiber coupled diode lasers or
  free space diode lasers.

3. A UV laser according to claim 1; further including one or more of:
  visible light power intensity of at least a factor of about 10 or more than its power outside of the one or more mirrors;
  an enhancement factor of between about 40 and about 100 when the one or more mirrors are highly reflective;
  sufficient visible high intensity light to provide a stable high intensity visible light requisite for a UV laser.

4. A UV laser according to claim 1; the gain chip being a MECSEL gain chip.

5. A UV laser according to claim 1; the UV laser being a MECSEL laser stimulated by at least either barrier pumping or in-well pumping.

6. A UV laser according to claim 1; including one or more of:
  manufacturing gain chips for use in the lasers,
  disposing an arrangement of lasers, and
  selecting a non-linear crystal (NLC) for use in the device.

7. A UV laser according to claim 1; including one or more of:
  (A) a stable high intensity visible light, and
  (B) a proper non-linear crystal, or periodically poled material to convert the visible light into UV light.

8. A UV laser according to claim 1; comprising one or more of:
  extracting a few watts of visible light power from the cavity via one or more partial reflecting cavity mirrors;
  electrically or optically pumping, a MECSEL quantum well (QW) or a MECSEL quantum dot (QD) producing an output;
  between the cavity mirrors, the visible light power intensity may be at least a factor of 10 or more than its power outside of the cavity mirrors;
  the enhancement factor being between about 40 and about 100 when all cavity mirrors are highly reflective;
  a semiconductor thin disc laser cavity, and particularly the MECSEL providing the necessary visible high intensity light to provide stable high intensity visible light for a UV laser.

9. A UV laser according to claim 1; including one or more of:
  one or more non-linear crystals (NLCs);
  one or more non-linear crystals (NLCs) that are walk-off compensated NLCs;
  one or more non-linear crystals (NLCs) that are beta Barium Boron Oxide (BBO); or one or more non-linear crystals (NLCs) that are walk-off compensated beta Barium Boron Oxide (BBO) NLCs.

10. A UV laser according to claim 1; comprising one or more of:
  cooling for high power operation;
  a gain region of a MECSEL gain chip having one or both a layered structure or layered arrangement for cooling; and,
  one or more of heat spreaders and reflectors layered, or sandwiched, around the QW structure.

11. A UV laser according to claim 1; including one or more of the gain chip comprising:
  a heat spreader as a first layer thereof;
  a heat spreader as a first layer thereof, the heat spreader being of a material or composition selected from SiC, GaAs, or a high-thermal conducting optic material for a cooling layer;
  a second layer being or including the one or more quantum wells or quantum dots; or
  a third layer being or including a heat spreader, a heat spreader including a distributed bragg reflector (DBR) or a DBR only.

12. A UV laser according to claim 1; the gain chip further being:
  a MECSEL gain chip;
  wherein and one or more of:
  the MECSEL gain chip having one or more additional heat spreaders;
  the MECSEL gain chip sandwiching the MECSEL QW structure between two cooling devices, or heat spreaders and,
  the MECSEL gain chip having no DBR structure.

13. A UV laser comprising:
a gain chip having one or more quantum wells or one or more quantum dots and
one or more mirrors; and,
further including one or more of:
the one or more mirrors being highly reflective;
the one or more quantum wells being semiconductor gain media for the laser;
the gain chip having one or more laser cavities, and the one or more quantum wells being enclosed inside the one or more laser cavities;
the gain chip having one or more semiconductor thin disc laser cavities, and particularly a VECSEL cavity or a MECSEL cavity; or
the one or more mirrors being disposed to extract light from the one or more cavities; the UV laser further comprising one or more of:
a MECSEL including
 a MECSEL gain chip that further has one or more MECSEL quantum wells, placing the MECSEL gain chip at the Brewster angle $\Theta_B$ or the polarization angle relative to the optical path;
 a MECSEL gain chip that further has one or more MECSEL quantum wells, placing the MECSEL gain chip at the Brewster angle $\Theta_B$ or the polarization angle relative to the optical path to eliminate an AR coating on the MECSEL's gain chip for Visible Wavelength Laser Light Source;
 a MECSEL gain chip that further has one or more MECSEL quantum wells, placing the MECSEL gain chip at the Brewster angle $\Theta_B$ or the polarization angle relative to the optical path, the Brewster angle reducing optical loss due to imperfect coating on the gain chip.

14. A UV laser according to claim 1; comprising one or more of:
additional elements to increase the power output of the UV laser;
additional optics and/or
a focusing lens.

15. A UV laser according to any of claim 1; comprising one or more of:
a focusing lens having a focal length of F1;
an end mirror having a radius of curvature of R2;
distances: D1, D2, and D3;
 D1 representing the distance between the surface of the gain chip and the focusing lens;
 D2 representing the distance between the focusing lens and an NLC; and
 D3 representing the distance between the NLC and the end mirror.

16. A UV laser according to claim 15; comprising one or more of:
the laser being operated at a wide range of power levels;
the laser being operated at a wide range of power levels by adjusting the UV power output by setting the F1/R2 to be equal to approximately 1 and the value of D1/(D2+D3) to be equal to approximately 2.

17. A UV laser according to claim 13; the gain chip comprises an optically bonded heat spreader as a first layer thereof, the heat spreader being a cooling material or composition selected from SiC, GaAs or a high-thermal conducting optic material; the high-thermal conducting optic material having a coefficient of thermal expansion similar to that of the semiconductor gain media.

18. A UV laser according to claim 13; comprising one or more of:
cooling for high power operation;
a gain region of a MECSEL gain chip having one or both a layered structure or layered arrangement for cooling; and,
one or more of heat spreaders and reflectors layered, or sandwiched, around the QW structure.

19. A UV laser according to claim 13; including one or more of the gain chip comprising:
a heat spreader as a first layer thereof;
a heat spreader as a first layer thereof, the heat spreader being of a material or composition selected from SiC, GaAs, or a high-thermal conducting optic material for a cooling layer;
a second layer being or including the one or more quantum wells or quantum dots; or
a third layer being or including a heat spreader, a heat spreader including a distributed bragg reflector (DBR) or a DBR only.

20. A UV laser according to claim 13; the gain chip further being:
a MECSEL gain chip;
wherein and one or more of:
the MECSEL gain chip having one or more additional heat spreaders;
the MECSEL gain chip sandwiching the MECSEL QW structure between two cooling devices, or heat spreaders and,
the MECSEL gain chip having no DBR structure.

* * * * *